United States Patent
Kuganesan et al.

(10) Patent No.: US 10,104,758 B2
(45) Date of Patent: Oct. 16, 2018

(54) HEAT SINK WITH CONFIGURABLE GROUNDING

(71) Applicants: Pararajasingam Kuganesan, Markham (CA); Hasan Al-Rubaye, La Jolla, CA (US); Mamadou Kane, Richmond Hill (CA)

(72) Inventors: Pararajasingam Kuganesan, Markham (CA); Hasan Al-Rubaye, La Jolla, CA (US); Mamadou Kane, Richmond Hill (CA)

(73) Assignee: ATI Technologies ULC, Markham (CA)

( * ) Notice: Subject to any disclaimer, the term of this patent is extended or adjusted under 35 U.S.C. 154(b) by 0 days.

(21) Appl. No.: 14/187,079

(22) Filed: Feb. 21, 2014

(65) Prior Publication Data

US 2015/0245464 A1     Aug. 27, 2015

(51) Int. Cl.
| | |
|---|---|
| *H05K 1/00* | (2006.01) |
| *H05K 1/02* | (2006.01) |
| *H05K 7/20* | (2006.01) |
| *H01L 23/36* | (2006.01) |
| *H01L 23/40* | (2006.01) |
| *H01L 23/552* | (2006.01) |
| *H01L 23/498* | (2006.01) |

(52) U.S. Cl.
CPC ........... *H05K 1/0203* (2013.01); *H01L 23/36* (2013.01); *H01L 23/4006* (2013.01); *H01L 23/552* (2013.01); *H05K 7/20* (2013.01); *H05K 7/2039* (2013.01); *H01L 23/49811* (2013.01); *H01L 2924/0002* (2013.01); *H05K 1/02* (2013.01); *H05K 1/0215* (2013.01); *H05K 2201/066* (2013.01); *Y10T 29/4935* (2015.01); *Y10T 29/49155* (2015.01)

(58) Field of Classification Search
CPC .......... H05K 1/02; H05K 1/0203; H05K 7/20; H05K 7/2039; H05K 2201/066
USPC .................... 361/679.54, 704, 717, 719, 818; 165/185; 257/706, 718; 174/16.3; 29/746, 890.03
See application file for complete search history.

(56) References Cited

U.S. PATENT DOCUMENTS

| | | | |
|---|---|---|---|
| 6,205,026 B1 | 3/2001 | Wong et al. | |
| 6,219,239 B1* | 4/2001 | Mellberg | H05K 9/002 165/80.3 |
| 6,278,615 B1* | 8/2001 | Brezina | H01L 23/433 174/51 |
| 6,317,328 B1* | 11/2001 | Su | H01L 23/4006 165/80.3 |
| 6,377,474 B1 | 4/2002 | Archambeault et al. | |
| 6,396,699 B1 | 5/2002 | Caldwell et al. | |
| (Continued) | | | |

*Primary Examiner* — Dimary Lopez Cruz
*Assistant Examiner* — Zhengfu Feng
(74) *Attorney, Agent, or Firm* — Timothy M. Honeycutt

(57) ABSTRACT

Various heat sink/circuit board combinations are disclosed. In one aspect, an apparatus is provided that includes a heat sink and plural contact pins coupled to the heat sink. Each of the contact pins is operable to selectively contact at least one of plural ground conductors of a circuit board. A given contact pin may be selectively moved relative to the heat sink to contact or not contact one of the ground conductors to provide the capability of controlling a number and location of ground points of the heat sink.

20 Claims, 7 Drawing Sheets

(56) References Cited

U.S. PATENT DOCUMENTS

| | | | |
|---|---|---|---|
| 6,606,246 B2* | 8/2003 | Wells | H01L 23/4093 |
| | | | 165/185 |
| 6,643,137 B1* | 11/2003 | Chung | H01L 23/367 |
| | | | 165/185 |
| 7,164,587 B1* | 1/2007 | Garnett | H01L 23/36 |
| | | | 174/350 |
| 7,327,577 B2* | 2/2008 | Gilliland | H01L 23/552 |
| | | | 257/706 |
| 7,990,713 B2 | 8/2011 | Liu et al. | |
| 2004/0095730 A1* | 5/2004 | Youm | H01L 23/4006 |
| | | | 361/718 |
| 2004/0257786 A1* | 12/2004 | Murasawa | H01L 23/4006 |
| | | | 361/810 |
| 2007/0058343 A1* | 3/2007 | Deng | H01L 23/4006 |
| | | | 361/695 |
| 2007/0272395 A1 | 11/2007 | Hwang et al. | |
| 2010/0157541 A1 | 6/2010 | Zhu et al. | |
| 2015/0201533 A1* | 7/2015 | Daughtry, Jr. | H05K 9/0028 |
| | | | 174/377 |

* cited by examiner

HEAT SINK WITH CONFIGURABLE GROUNDING

BACKGROUND OF THE INVENTION

1. Field of the Invention

This invention relates generally to electronic devices, and more particularly to heat sinks for providing thermal management of electronic devices, including semiconductor chips.

2. Description of the Related Art

Circuit boards, such as printed circuit boards, are used in a vast array of electronic devices. Examples of such devices are legion, and include devices as diverse as ultrasound machines and cellular telephone handsets. A typical conventional circuit board includes a substrate upon which several components are mounted. The components can include integrated circuits, and passive devices such as capacitors, resistors and inductors. In some applications, the circuit board itself or one or more components mounted thereon may dissipate sufficient amounts of heat so that thermal management may be necessary. This may be due to the potential for the undissipated heat to adversely affect the performance or damage components of the device and/or for the heat to cause the temperature of the device in question to climb above a comfortable level for user handling.

Many conventional circuit boards that require thermal management utilize a heat sink of one design or another. Conventional heat sinks are frequently fabricated from a thermally conducting metallic material, such as copper or aluminum. These types of heat sinks can affect the electronic performance of the component requiring thermal management or other components that may be affected by emissions from the heat sink itself. For example, the component requiring thermal management may receive spurious signals associated with the heat sink or have its own emissions, as in the case of a communications device, attenuated or otherwise degraded by the action of the heat sink. Similarly, the heat sink may create or change emissions that may effect the performance of other components on the circuit board.

A given conventional heat sink may be qualified for a particular application by making an assessment of the heat sink's electromagnetic compatibility (EMC). Typically, the EMC of a given heat sink and circuit board combination involves a determination of the level of emissions generated by the heat sink and an assessment of whether those emissions exceed a specification for the combination as well as a determination or a measurement of potential signal attenuation associated with the heat sink. In typical conventional heat sink designs, the EMC of the heat sink and circuit board combination is determined by the number and location of grounding points for the heat sink to the circuit board. Usually this involves grounding the heat sink at certain known ground pad locations on the circuit board. The selection of the grounding points for a given conventional heat sink is typically set in advance. In essence, once the conventional heat sink is fabricated, the location and number of grounding points will be set. If, thereafter, the combination of the heat sink and the circuit board in a given application fails to meet EMC, then there will be relatively few choices to try to change the grounding characteristics for that particular heat sink and circuit board combination.

The present invention is directed to overcoming or reducing the effects of one or more of the foregoing disadvantages.

SUMMARY OF EMBODIMENTS OF THE INVENTION

In accordance with one aspect of an embodiment of the present invention, an apparatus is provided that includes a heat sink and plural contact pins coupled to the heat sink. Each of the contact pins is operable to selectively contact at least one of plural ground conductors of a circuit board. A given contact pin may be selectively moved relative to the heat sink to contact or not contact one of the ground conductors to provide the capability of controlling a number and location of ground points of the heat sink.

In accordance with another aspect of an embodiment of the present invention, a method of thermally managing a component of a circuit board that has plural ground conductors is provided. The method includes placing a heat sink in thermal contact with the component. The heat sink includes plural contact pins. Each of the contact pins is operable to selectively contact at least one of plural ground conductors of a circuit board. One or more of the contact pins is selectively moved to contact or not contact one of the ground conductors to control a number and location of ground points of the heat sink.

In accordance with another aspect of an embodiment of the present invention, a method of manufacturing is provided. The method includes fabricating a heat sink and forming plural holes in the heat sink. At least some of the holes are in a first pattern to match a second pattern of ground conductors of a circuit board. The at least some of the holes are capable of receiving plural contact pins capable of being selectively moved to contact or not contact corresponding of the ground conductors to provide the capability of controlling a number and location of ground points of the heat sink.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a semiconductor chip device are described herein. In one variant, a heat sink includes plural contact pins. Each of the contact pins is operable to selectively contact at least one of plural ground conductors of a circuit board. A given contact pin may be selectively moved relative to the heat sink to contact or not contact one of the ground conductors to provide the capability of controlling a number and location of ground points of the heat sink. A technical goal is to provide the capability to change the number and location of grounding points as necessary to establish electromagnetic compatibility (EMC) for the heat sink and circuit board combination in a variety of different applications, such as portable computing devices, desktop computing devices or others.

Figure 1:
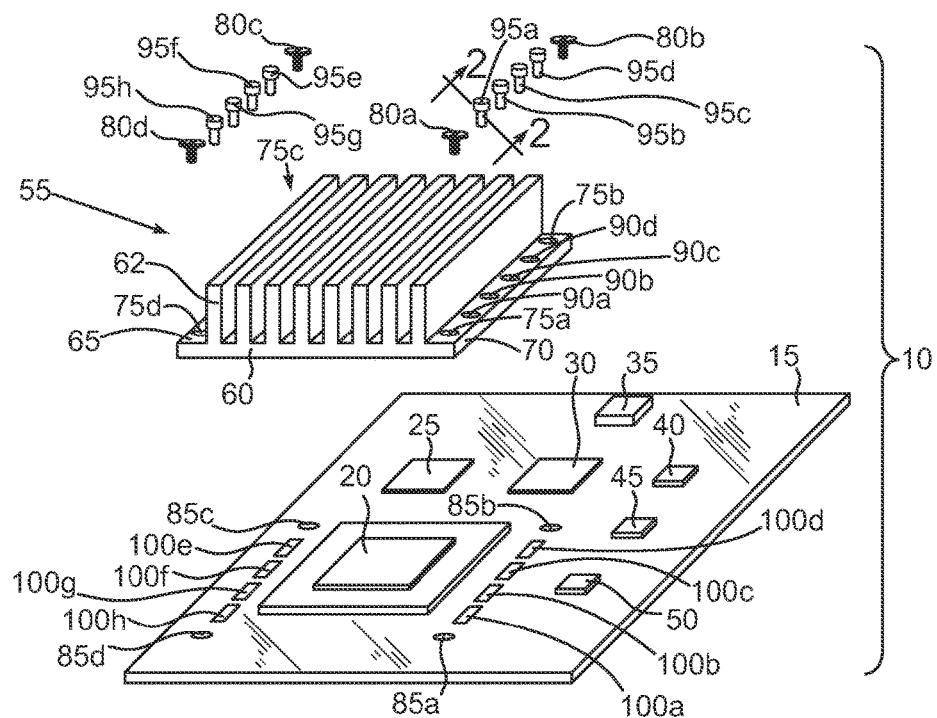
FIG. 1 is a partially exploded pictorial view of an exemplary embodiment of a semiconductor chip device that includes a circuit board and a heat sink.

In the drawings described below, reference numerals are generally repeated where identical elements appear in more than one figure. Turning now to the drawings, and in particular to FIG. 1, therein is shown a partially exploded pictorial view of an exemplary embodiment of a semiconductor chip device 10 that includes a circuit board 15 that may be populated with various types of electrical/electronic components, a few of which are depicted and labeled 20, 25, 30, 35, 40, 45 and 50, respectively. The components 20, 25, 30, 35, 40, 45 and 50 may number more or less than the seven shown and may be any of a great variety of different types of electronic and electrical components that may be mounted on a circuit board and include items such as integrated circuits, passive devices, such as resistors, inductors and capacitors, or virtually any other type of component.

The circuit board 15 may be a system board, a circuit card or virtually any other type of printed circuit board. The circuit board 15 may be monolithic or a laminate. If a laminate, well-known epoxy resins impregnated with glass or other fillers may be used. The circuit board 15 may include multiple layers of metallization (not shown). In this illustrative embodiment, the circuit board 15 has a generally rectangular footprint. However, the skilled artisan will appreciate that the circuit board 15 may have virtually any shape.

An exemplary heat sink 55 may be mounted on the circuit board 15 to provide thermal management for one or more of the components 20, 25, 30, 35, 40, 45 and 50, and in this example for component 20. As discussed in more detail below, the heat sink 55 may take on a variety of different configurations. In this illustrative embodiment, the heat sink 55 includes a base 60 that is designed to seat on the component 20. The base 60 includes side flanges 65 and 70 that are populated with plural holes. Holes 75a, 75b, 75c (not visible) and 75d located at the corners of the base 60 may be set aside to receive mounting screws 80a, 80b, 80c and 80d that secure the heat sink 55 to the circuit board 15 by way of holes 85a, 85b, 85c and 85d in the circuit board 15. Fasteners other than the screws 80a, 80b, 80c and 80d may be used such as pins or other types of fasteners. Indeed, it may be possible to use an adhesive to secure the heat sink 55 in place. The side flange 70 may also be provided with holes 90a, 90b, 90c and 90d and the side flange 65 a corresponding set of holes that are not visible. The holes 90a, 90b, 90c and 90d and those not visible, are designed to receive respective contact pins 95a, 95b, 95c, 95d, 95e, 95f, 95g and 95h. The contact pins 95a, 95b, 95c, 95d, 95e, 95f, 95g and 95h are configured to at least partially project through the holes 90a, 90b, 90c and 90d and those not visible, and make ohmic contact with ground pads 100a, 100b, 100c, 100d, 100e, 100f, 100g, 100h and 100i that are provided on the upper surface of the circuit board 15. The holes 90a, 90b, 90c and 90d and those not visible are arranged in a first pattern that is intended to match the pattern of the ground pads 100a, 100b, 100c, 100d, 100e, 100f, 100g and 100h. As discussed in more detail below, any of the contact pins 95a, 95b, 95c, 95d, 95e, 95f, 95g and 95h may be inserted or removed from the holes 90a, 90b, 90c, 90d and 90h and those not visible to provide a customizable electromagnetic emission/reception environment associated with the heat sink 55 and the circuit board 15. The number and arrangement of the contact pins 95a, 95b, 95c, 95d, 95e, 95f, 95g and 95h may be varied.

The heat sink 55, including the base 60 and fins 62, any disclosed alternatives, may be constructed of a variety of well-known thermally conducting materials. Examples include copper, nickel, aluminum, steel, combinations of these or the like. The base 60 and fins 62 can be of the same or different materials. The holes 75a, 75b, 75c, 75d, 90a, 90b, 90c and 90d and those not visible may be formed using well-known techniques, such as mechanical drilling, laser drilling, water drilling, punching, casting or other techniques.

Figure 2:
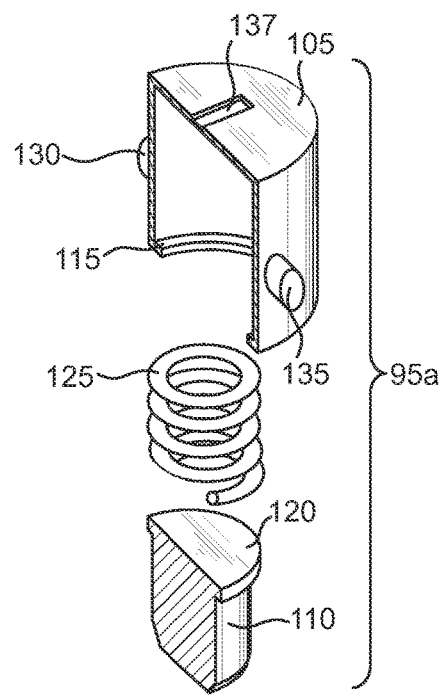
FIG. 2 is a sectional view of FIG. 1 taken at section 2-2.

An exemplary embodiment of the contact pin 95a is shown in an exploded pictorial and sectional view in FIG. 2. Note the contact pin 95a is sectioned at section 2-2 shown in FIG. 1. The following description of the contact pin 95a will be illustrative of the other pins 95b, 95c, 95d, 95e, 95f, 95g and 95h. The contact pin 95a may be a cylinder and piston arrangement that includes a generally cylindrical cylinder or housing 105 and a piston 110 that is designed to be slidedly retained within the cylinder 105. The piston 110 is prevented from slipping completely out of the cylinder 105 by way of a flange 115 that projects radially inwardly from a lower end of the cylinder 105 and a cooperating flange 120 on an upper end of the piston 110. A spring 125 is seated on the flange 120 and is designed to bias the piston 110 toward the ground pad 100a when the contact pin 95a is positioned in the hole 90a of the heat sink 55 shown in FIG. 1. Spring types other than coil springs may be used in lieu of the coil spring 125. The cylinder 105 may be provided with radially projecting dogs 130 and 135 positioned on opposite surfaces as shown. As described in more detail below, the dogs 130 and 135 are designed to engage surfaces of the opening 90a to help in retaining the contact pin 95a in the opening 90a following insertion. The top of the cylinder 105 may be provided with a torque element 137 designed to enable the user to twist the contact pin 95a. Here, the torque element 137 is a screw driver slot, but of course, other designs are envisioned. The elements of the contact pin 95 such as the cylinder 105, the piston 110 and the coiled spring may be composed of a variety of electrically conducting materials, such as, for example, brass, copper, stainless steel, aluminum, gold combinations of these or the like.

Figure 3:
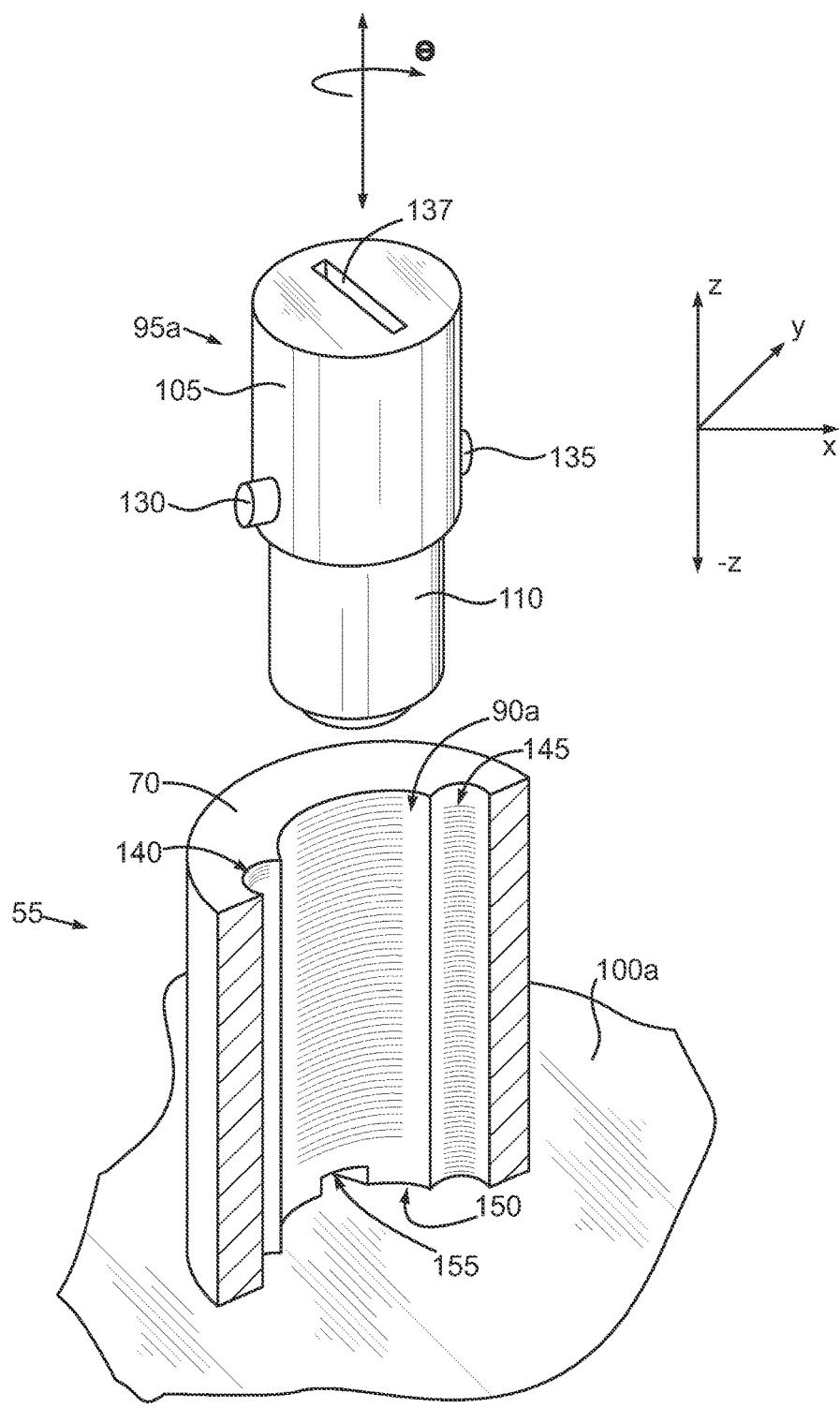
FIG. 3 is a pictorial view of an exemplary contact pin exploded from an exemplary contact hole shown in section.

The insertion and removal of the contact pin 95a from the heat sink 55 will now be described in conjunction with FIG. 3. FIG. 3 depicts in section a small portion of the heat sink 55, and in particular the right flange 70 thereof proximate the hole 90a, and the hole 90a itself. Note that a small portion of the underlying ground pad 100a is depicted as well. The contact pin 95a is shown pictorially and positioned above the opening 90a in a position corresponding to just prior to insertion or just following removal. The opening 90a may be provided with diametrically opposed slots 140 and 145 that are designed to enable the dogs 130 and 135, respectively, to slidedly translate along the z-axis. At the underside 150 of the heat sink 55, a slot 155 is provided that is large enough to easily accommodate one or the other of the dogs 130 and 135. Thus, the insertion process involves aligning the contact pin 95a with the opening 90a, dropping the contact pin 95a into the hole 90a in the −z direction with the dogs 130 and 135 sliding down through the slots 140 and 145. Once the cylinder 110 contacts the ground pad 100*a*, compressive force is placed on the cylinder 105 by way of a tool and the torque element 137 as necessary until the dogs 130 and 135 clear the lower surface 150. At this point the cylinder 105 may be rotated in the x-y plane through some angle θ, which may be 90° or some other angle depending upon the axial position of the slot 155, until one of the other dogs 130 and 135 pops into the slot 155. At this point compressive force may be released from the cylinder 105 and the pin 95*a* will thus be retained in position. Removal of the pin 95*a* simply entails a reversal of the aforementioned steps.

Figure 4:
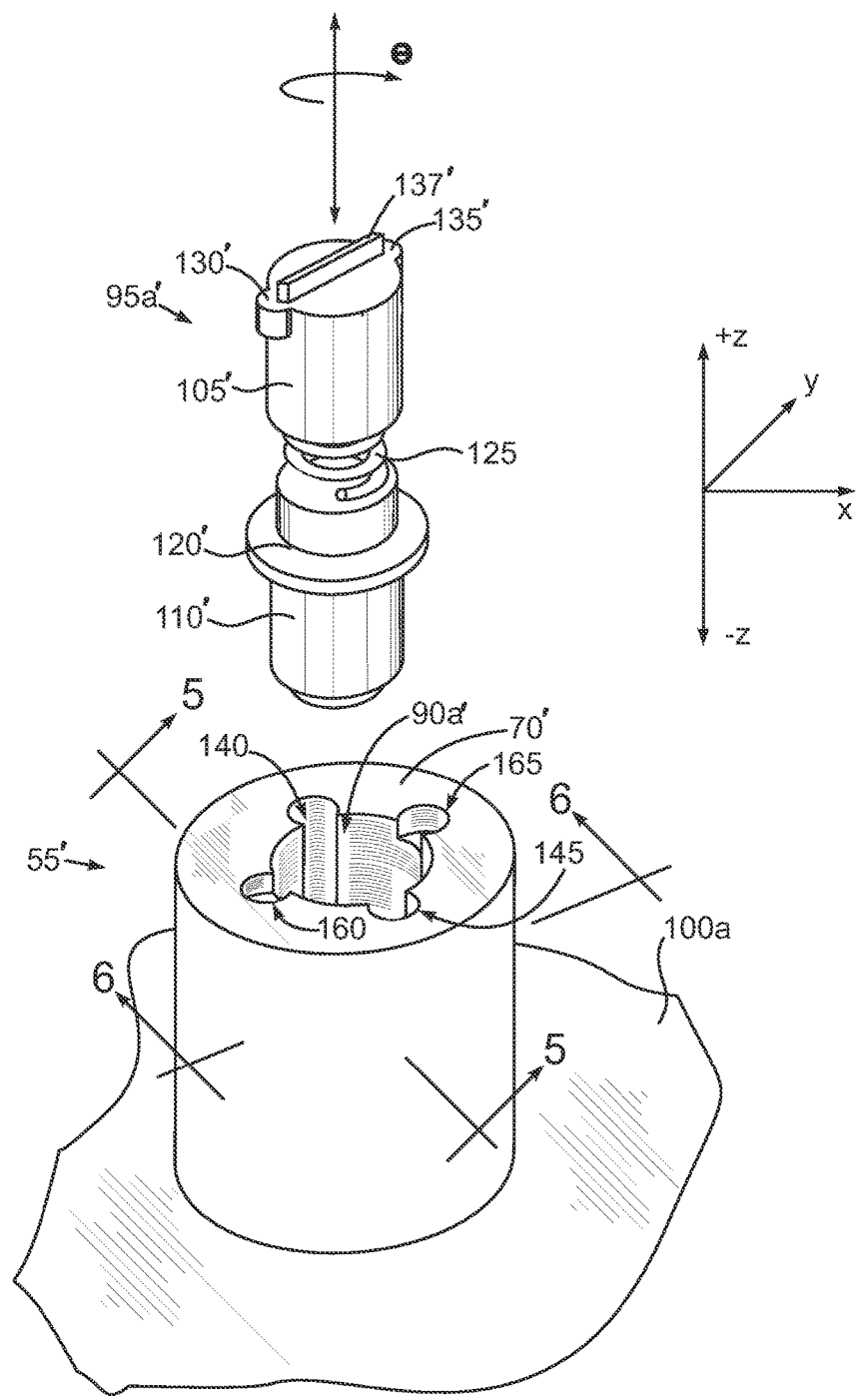
FIG. 4 is a pictorial view of an alternate exemplary contact pin exploded from an alternate exemplary contact hole.

An alternate exemplary embodiment of a contact pin 95*a*' may be understood by referring now to FIG. 4. FIG. 4 shows the contact pin 95*a*' exploded from a portion of an alternate exemplary heat sink 55', and in particular the flange 70' thereof proximate an opening 90*a*' that is designed to receive the pin 95*a*'. In this illustrative embodiment, the contact pin 95*a*' includes a cylinder 105' and a piston 110'. However, the piston 110' is not designed to be retained within the housing 105' in the way that the contact pin 95*a* functions as described above. The piston 110' is provided with a flange 120', but not to engage an interior of the cylinder 105'. Instead, the flange 120' is configured to engage a lip in the hole 90*a*' that will be shown in a subsequent figure. In this illustrative embodiment, the piston 110' is spring biased relative to the housing 105' by way of a coiled spring 125 as generally described above in conjunction with the other embodiment. Since this embodiment of the pin 95*a*' is designed to be attached to the heat sink 55' and reside there prior to attachment of the heat sink 55' to a circuit board, various structures are provided to help twist as necessary and to retain the pin 95*a*' in the opening 90*a*' following connection to the circuit board 55'. In particular, the cylinder 105' is provided with oppositely positioned dogs 130' and 135' positioned near or at the top of the cylinder 105' and a torque element 137', in this case a horizontal flange. The dogs 130' and 135' are designed to slide along the z-axis in the diametrically opposed slots 140 and 145 in the hole 90*a*' like those of the embodiment depicted in FIG. 3 and discussed above.

Figure 5:
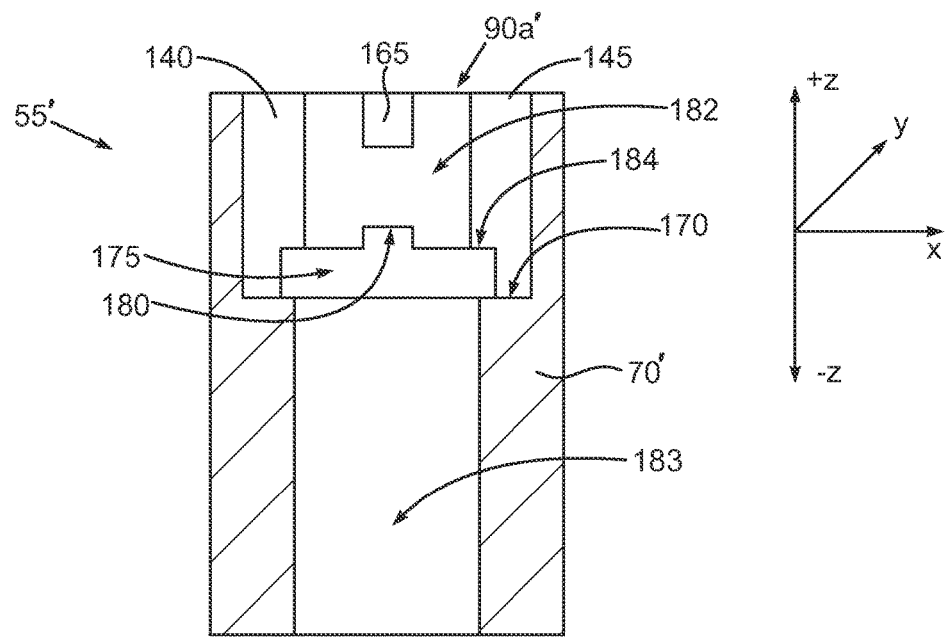
FIG. 5 is a sectional view of FIG. 4 taken at section 5-5.

Before turning to a discussion of the manipulation of the contact pin 95*a*' in detail, it may be useful to describe some additional details of the opening 90*a*' that are not readily apparent from FIG. 4. In this regard, attention is now turned to FIGS. 5 and 6, which are sectional views of the portion of the flange 70' depicted in FIG. 4 taken at sections 5-5 and 6-6, respectively. Referring first to FIG. 5, it should be understood that due to the location of section 5-5, the slot 165 is shown, but the slot 160, though visible in FIG. 4, is not in view. The slots 140 and 145 do not extend through the entire depth of the flange 70' but instead terminate in an upwardly projecting annular surface 170. Adjoining the slots 140 and 145 in space is an annular space 175 formed in the inner diameter of and proceeding from and tracking spatially the upwardly projecting annular surface 170. The annular space 175 is designed to enable one or other of the dogs 130' or 135' to be rotated through some angle during manipulation of the pin 95*a*' as described in more detail below. At an upper surface of the annular void 175, a slot 180 is provided that projects upwardly and provides a space in which one or the other of the dogs 130' or 135' may project after rotation of the pin 95*a* to provide alignment between the dogs 130' and 135' and that slot 180. In a corresponding and diametrically opposed slot (not shown) as well as an annular space are provided on the opposite side of the opening 90*a*'. The portion 182 of the hole 90*a*' above the annular space 175 is smaller in diameter than the portion 183 of the hole 90*a*' below the annular space 175. This defines a downwardly facing annular lip 184. If the contact pin 95*a*' is positioned in the hole 90*a*', and the heat sink 55' is flipped over from the orientation shown in FIGS. 4 and 5, the flange 120' will engage the lip 184 to prevent the contact pin 95*a*' from falling out of the hole 90*a*'.

Figure 6:
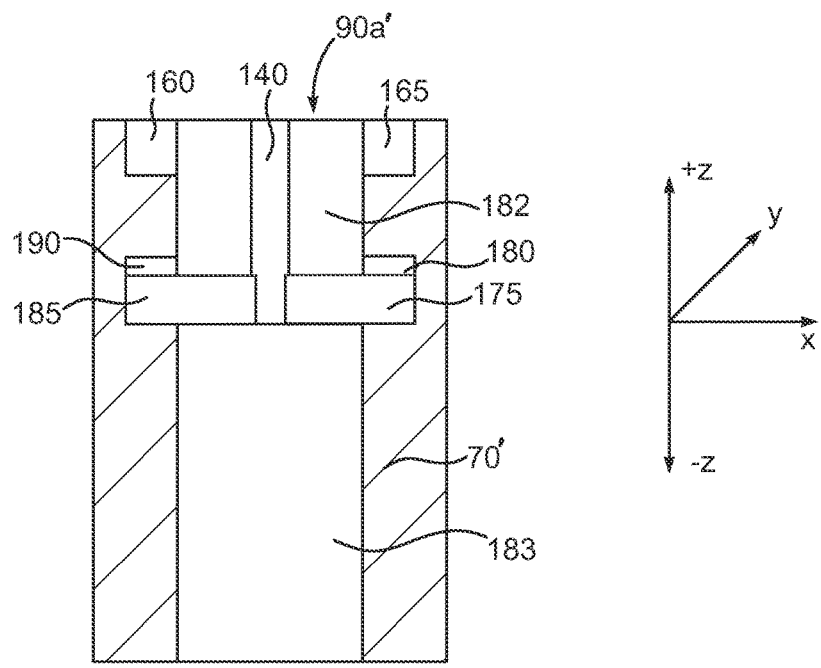
FIG. 6 is a sectional view of FIG. 4 taken at section 6-6.

Attention is now turned also to FIG. 6. Due to the location of section 6-6, the slots 155 and 160 are visible as well as the slot 140, but the slot 145 is not visible. Here, both the annular space 175 and the slot 180 as well as the oppositely positioned annular space 185 and slot 190 are visible. The insertion and removal of the contact pin 95*a*' will now be described in conjunction with FIGS. 4, 5 and 6. To connect the pin 95*a*' to the heat sink flange 70', the cylinder 105' is first moved up through the portion 182 and then the portion 183 of the hole 90*a*' with the dogs 130' and 135' in alignment with the slots 140 and 145. When the dogs 130' and 135' clear the hole 90*a*', the contact pin 95*a*' may be rotated (by manipulating the torque element 137' or otherwise) until the dogs 130' and 135' line up with the slots 160 and 165. At this point, the contact pin 95*a*' may be allowed to seat with the dogs 130' and 135' in the slots 160 and 165. To remove the contact pin 95*a*', the foregoing procedure is reversed.

The procedures to engage the pin 95*a*' with the ground pad 100*a* will now be described in conjunction again with FIGS. 4, 5 and 6. The contact pin 95*a*' is moved in the +z direction until the dogs 130' and 135' clear the slots 160 and 165. A twisting movement is performed until the dogs 130' and 135' align with the slots 140 and 145 and the cylinder 105' and piston 110' are moved in the −z direction until the piston 110' contacts the ground pad 100*a*. When cylinder 105' is depressed further, the dogs 130' and 135' will slide down the slots 140 and 145 until the annular spaces 175 and 185 are reached at which point the cylinder 105' may be rotated through some angle θ in the x-y plane until the dogs 130' and 135' are in alignment with the slots 180 and 190 at which point compressive force may be released and the spring 125 will bias the piston 110' against the ground pad 100*a* and the cylinder 105' so that the dogs 130' and 135' are retained in the slots 180 and 190. If it is desired to disengage the piston 110' from the ground pad 100*b* then the process is reversed, that is, compressive forces applied to the cylinder 105' until the dogs 130' and 135' clear the slots 180 and 190 and the cylinder 105' is turned in some direction until the dogs 130' and 135' line up with the slots 140 and 145 and compressive forces released. Note that the purpose of the flange 120' of the cylinder 110 is to prevent the pin 95*a*' from falling out of the opening 90*a*' if the heat sink 55' is flipped over.

Figure 7:
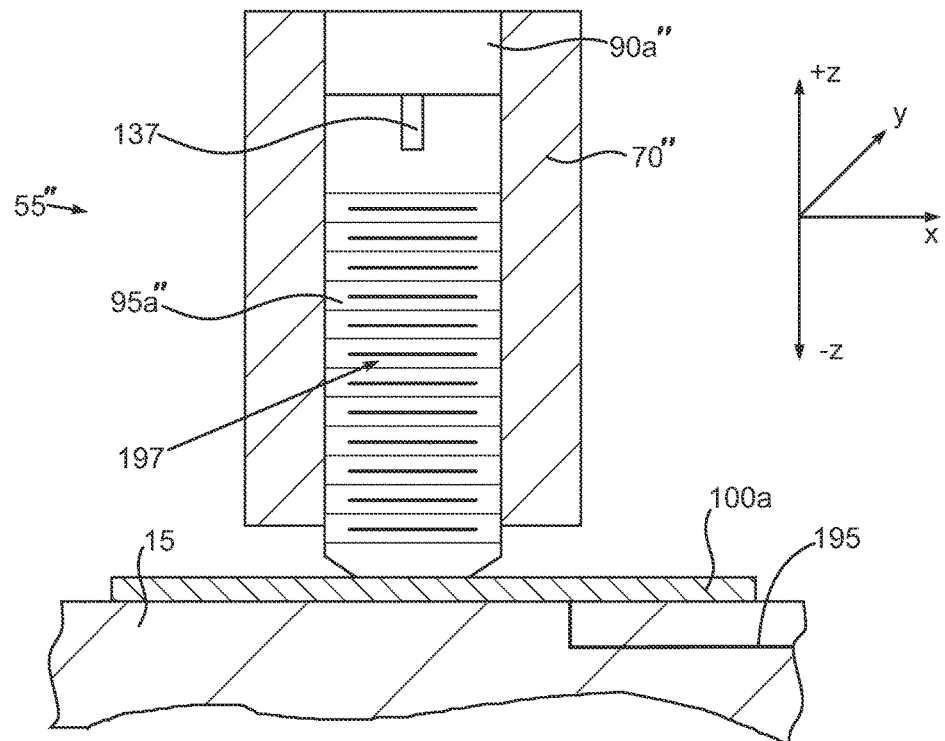
FIG. 7 is a sectional view of an alternate exemplary contact pin positioned in an alternate exemplary contact hole.

In still another alternate exemplary embodiment depicted in section in FIG. 7, a contact pin 95*a*" may be implemented as a threaded screw as shown. Here, a small portion of heat sink right flange 70" is depicted as well as a small portion of the circuit board 15 and the ground pad 100*a*. Here, the ground pad 100*a* may be surface located as described above and connected to a ground plane 195 associated with the circuit board 15. This embodiment of the contact pin 95*a*" may be inserted into a threaded hole 90*a*" in the heat sink 55" and advanced in the along the z-axis either in the +z or −z direction to engage or disengage the ground pad 100*a* as desired. Again, a tool slot 137 of the type described above may be provided in the contact pin 95*a*" of virtually any design. The threads 197 of the contact pin 95*a*" may be of any configuration. The contact pin 95*a*" may connected to the heat sink 55" prior to or after the heat sink 55" is mounted to the circuit board 15.

Figure 8:
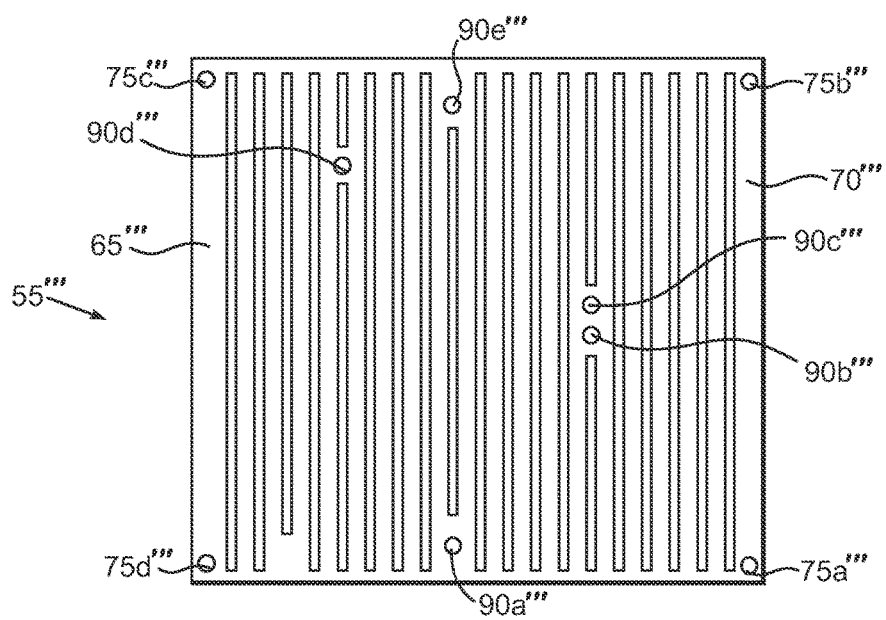
FIG. 8 is a plan view of an alternate exemplary heat sink.

The skilled artisan will appreciate that heat sinks and contact pin holes for selective grounding may take on a great variety of different configurations. In this regard, attention is now turned to FIG. 8, which is a plan view of an alternate exemplary embodiment of a heat sink 55'''. Here, the heat sink 55''' may again include a pair of external flanges 65''' and 70''' and screw mounting holes 75a''', 75b''', 75c''' and 75d'''. However, the contact holes 90a''', 90b''', 90c''', 90d''' and 90e''' may be dispersed throughout the footprint of the heat sink 55''' and not just positioned proximate the flanges 65''' and 70'''. Again, these holes 90a''', 90b''', 90c''', 90d''' and 90e''' may be arranged to correspond to the locations of ground pads (not shown) of an underlying circuit board. Pins of the types described herein (not shown) may be selectively engaged or disengaged via the holes 90a''', 90b''', 90c''', 90d''' and 90f''' as described above.

Figure 9:
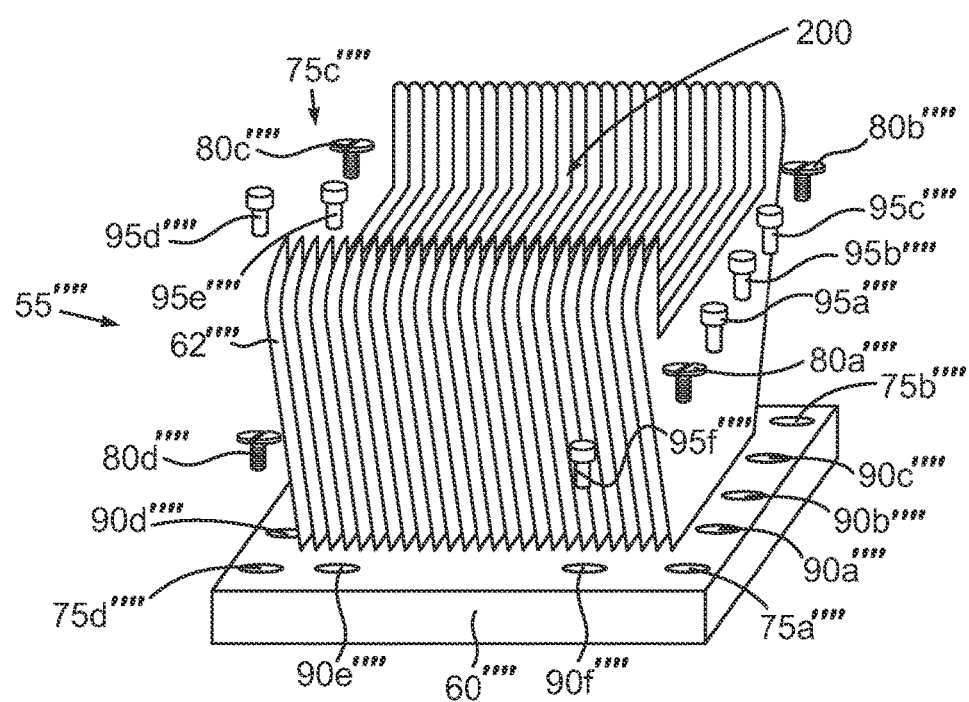
FIG. 9 is a pictorial view of another alternate exemplary heat sink.

Another alternate exemplary embodiment of a heat sink 55''' is depicted pictorially in FIG. 9. Here, the heat sink 55'''' includes a base member 60'''' and a plurality of upwardly projecting fins 62''''. The fins 62'''' have cut outs that collectively define an internal space 200 that may be suitable for a cooling fan or other device (not shown). The base 60'''' may be composed of a thermally conducting material and seated on a circuit board or component thereof as described above. Here, the base may include fastener holes 75a'''', 75b'''', 75c'''' designed to receive mounting screws 80a'''', 80b'''', 80c'''' and 80d'''', and plural contact pin holes 90a'''', 90b'''', 90c'''', 90d'''', 90e'''' and 90f'''' designed to receive plural contact pins 95a'''', 95b'''', 95c'''', 95d'''', 95e'''' and 95f'''', which may be configured like any of the disclosed embodiments or alternatives thereof. Again the material point is that a great variety of heat sink configurations may be utilized with the provision of selective grounding contact pins as described herein.

Figure 10:
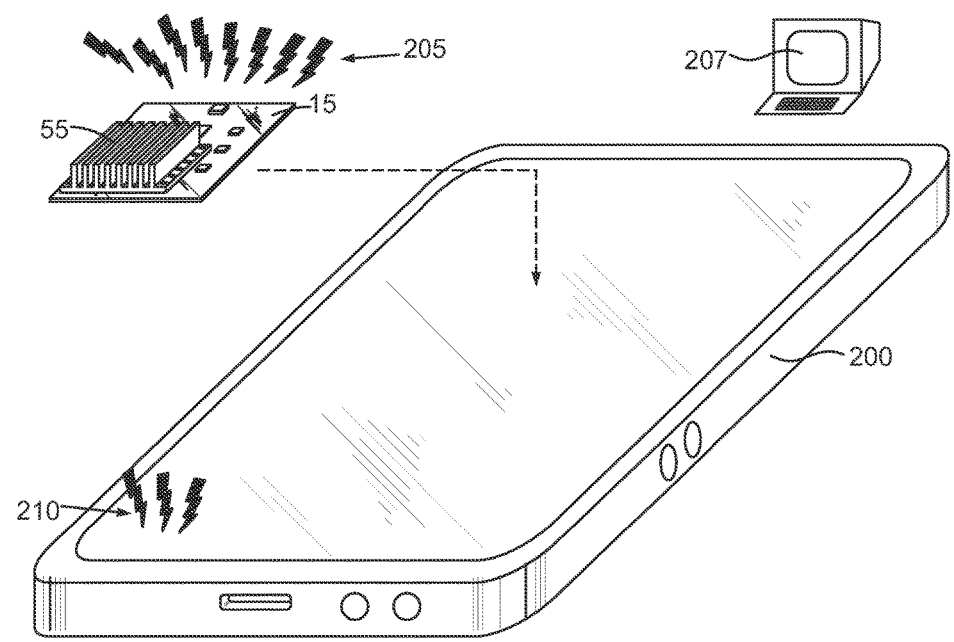
FIG. 10 is a pictorial view of exemplary electronic devices and an exemplary semiconductor chip device exploded therefrom.
Figure 10:
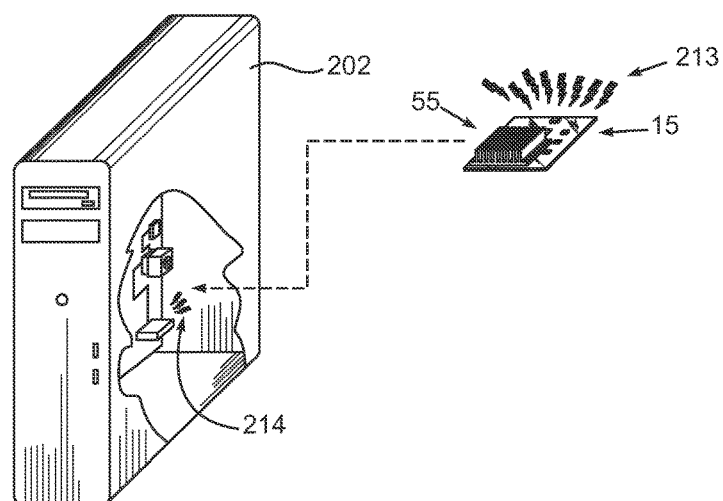

It should be understood that any of the disclosed embodiments of a circuit board and heat sink such as the circuit board 15 and the heat sink 55 may be placed in an electronic device. Different types of electronic devices may present different electromagnetic environments and the affect the EMC of the heat sink and circuit board combination. For example, and as shown in FIG. 10, the circuit board 15 and heat 55, and any disclosed alternatives, may be placed in electronic devices 200 and/or 202. The computing devices 200 and 202 may be a be a computer, a digital television, a handheld mobile device, a personal computer, a server, a memory device, an add-in board such as a graphics card, or any other computing device employing semiconductors. When coupled to the computing device 200, the circuit board 15 and heat sink 55 combination may be tested for EMC with the computing device 200. This may include using a testing instrument 207 to sense the electromagnetic emissions 205 from the circuit board 15 during operation and determining if those emissions 205 exceed specifications. If the emissions do exceed specifications, then one or more of the contact pins 95a, 95b, 95c, 95d, 95e, 95f, 95g and 95h (see FIG. 1) may be changed, that is, engaged or disengaged with ground pads to change the grounding configuration of the heat sink 55 and the test repeated. This may be repeated using various contact pin to ground arrangements to find a configuration that provides acceptable levels of the emissions 205. The same type of procedure may be used to test for levels of emissions 210 from the computing device 200 that may interfere with the circuit board 15. The testing instrument 207 may be used to sense if the emissions 210 exceed noise level specifications for the circuit board 15. If so, then the same selective grounding of contact pins may be used to find a configuration that provides acceptable levels of noise. Similarly, the circuit board 15 and heat sink 55 combination may be tested with the instrument 207 after placement in the electronic device 202. Here, the emissions 213 from the circuit board 15 and emissions 214 from the electronic device may be assessed for EMC as just described in conjunction with the computing device 200. Thus, the circuit board 15 and heat sink 55 may be EMC qualified for different environments using the configurable contact pins 95a, 95b, 95c, 95d, 95e, 95f, 95g and 95h (see FIG. 1).

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising:
    a heat sink;
    plural contact pins coupled to the heat sink;
    at least one fastener to secure the heat sink to a circuit board, the circuit board having plural ground conductors; and
    whereby each of the contact pins is selectively movable relative to the heat sink independently of the at least one fastener to contact or not contact one of the ground conductors without forcing the heat sink toward the circuit board to control a number and location of ground points of the heat sink.

2. The apparatus of claim 1, wherein the heat sink comprises plural contact pin holes, each of the contact pin holes for receiving one of the contact pins.

3. The apparatus of claim 1, wherein each contact pin comprises a cylinder, spring coupled to the cylinder and a piston coupled to the spring.

4. The apparatus of claim 1, wherein each contact pin comprises a threaded pin.

5. The apparatus of claim 1, comprising the circuit board including the ground conductors and at least one component, the heat sink being positioned on the circuit board in thermal contact with the at least one component.

6. The apparatus of claim 5, comprising an electronic device, the circuit board being positioned in the electronic device.

7. A method of thermally managing a component of a circuit board having plural ground conductors, comprising:
    placing a heat sink in thermal contact with the component and securing the heat sink to the circuit board with at least one fastener, the heat sink including plural contact pins, each of the contact pins being movable relative to the heat sink to selectively contact at least one of plural ground conductors of the circuit board without forcing the heat sink toward the circuit board; and
    selectively moving one or more of the contact pins independently of the at least one fastener to contact or not contact one of the ground conductors to control a number and location of ground points of the heat sink.

8. The method of claim 7, wherein the heat sink comprises plural contact pin holes, each of the contact pin holes for receiving one of the contact pins, the method comprising moving the one or more of the contact pins relative to one or more of the contact holes.

9. The method of claim 7, wherein each contact pin comprises a cylinder, spring coupled to the cylinder and a piston coupled to the spring, the method comprises moving the one or more contact pins until the piston of each is spring biased or not against one of the ground conductors.

10. The method of claim 7, wherein each contact pin comprises a threaded pin, the method comprises twisting the threaded pin to move it.

11. The method of claim 7, comprising positioning the circuit board and the heat sink in an electronic device and testing the circuit board for electromagnetic compatibility with the electronic device.

12. The method of claim 11, comprising changing the number and/or location of ground points if the electromagnetic compatibility test fails.

13. A method of manufacturing, comprising:
fabricating a heat sink, the heat sink being operable to engage with at least one fastener to secure the heat sink to a circuit board; and
forming plural holes in the heat sink, at least some of the holes being in a first pattern to match a second pattern of ground conductors of the circuit board, the at least some of the holes for receiving plural contact pins being selectively movable relative to the heat sink independently of the at least one fastener to contact or not contact corresponding of the ground conductors to provide the capability of controlling a number and location of ground points of the heat sink without forcing the heat sink toward the circuit board.

14. The method of claim 13, comprising placing the contact pins in the at least some of the holes.

15. The method of claim 14, wherein each contact pin comprises a cylinder, spring coupled to the cylinder and a piston coupled to the spring.

16. The method of claim 14, wherein each contact pin comprises a threaded pin.

17. The method of claim 14, comprising positioning the heat sink on the circuit board and in thermal contact with at least one component of the circuit board and moving at least one of the contact pins into contact with one of the ground conductors.

18. The method of claim 17, comprising positioning the circuit board in an electronic device.

19. The method of claim 18, comprising changing which of the contact pins contact any of the ground conductors after the circuit board is positioned in the electronic device.

20. The method of claim 18, testing the circuit board for electromagnetic compatibility with the electronic device.

* * * * *